US012632637B2

(12) United States Patent
Kim et al.

(10) Patent No.: US 12,632,637 B2
(45) Date of Patent: May 19, 2026

(54) MULTIPLY-INSTANTIATED BLOCK MODELING FOR CIRCUIT COMPONENT PLACEMENT IN INTEGRATED CIRCUIT

(71) Applicant: Google LLC, Mountain View, CA (US)

(72) Inventors: Myung-Chul Kim, San Jose, CA (US); Roger David Carpenter, Novato, CA (US); Debjit Sinha, Fremont, CA (US); Paul Kingsley Rodman, Palo Alto, CA (US); Xuyang Jin, Austin, TX (US); Young-Joon Lee, Saratoga, CA (US)

(73) Assignee: Google LLC, Mountain View, CA (US)

( * ) Notice: Subject to any disclaimer, the term of this patent is extended or adjusted under 35 U.S.C. 154(b) by 791 days.

(21) Appl. No.: 17/973,078

(22) Filed: Oct. 25, 2022

(65) Prior Publication Data

US 2024/0143885 A1    May 2, 2024

(51) Int. Cl.
*G06F 30/392* (2020.01)
*G06F 30/398* (2020.01)

(52) U.S. Cl.
CPC .......... *G06F 30/392* (2020.01); *G06F 30/398* (2020.01)

(58) Field of Classification Search
CPC .............................. G06F 30/392; G06F 30/398
USPC ......................................................... 716/100
See application file for complete search history.

(56) References Cited

U.S. PATENT DOCUMENTS

| | | | | |
|---|---|---|---|---|
| 6,249,902 B1 * | 6/2001 | Igusa | ................... | G06F 30/392 |
| | | | | 716/135 |
| 6,370,679 B1 * | 4/2002 | Chang | ....................... | G03F 1/36 |
| | | | | 430/30 |
| 6,865,726 B1 * | 3/2005 | Igusa | ................... | G06F 30/392 |
| | | | | 716/124 |
| 8,407,228 B1 * | 3/2013 | Hahn | ................... | G06F 16/282 |
| | | | | 707/745 |

(Continued)

FOREIGN PATENT DOCUMENTS

| | | |
|---|---|---|
| JP | H11307644 A | 11/1999 |
| JP | 2004030308 A | 1/2004 |

(Continued)

OTHER PUBLICATIONS

Office Action for Japanese Patent Application No. 2023-577745 dated Mar. 25, 2025. 4 pages.

(Continued)

*Primary Examiner* — Suresh Memula
(74) *Attorney, Agent, or Firm* — Lerner David LLP

(57) ABSTRACT

Aspects of the disclosure provide for eliminating or reducing uniquification of blocks in a chip-level graph of a computer chip, to reduce the size of the graph while still encoding block-specific information. For each group of blocks in the graph generated from a multiply-instantiated block (MIB), a block in the group is selected as a base block. The physical position of the base block is encoded in a reduced graph, and the physical positions of the remaining blocks are encoded as a linear transformation of the physical position of the base block across the face of the chip. Each group of blocks (Continued)

instantiated from the same MIB is represented as a single instance. The reduced graph can be fed into a device configured to perform a circuit component placement process, to identify the placement of circuit components for blocks in the chip in accordance with one or more objectives.

18 Claims, 7 Drawing Sheets

(56) References Cited

U.S. PATENT DOCUMENTS

| | | | | |
|---|---|---|---|---|
| 8,413,093 | B1* | 4/2013 | Rao | G06F 30/3312 |
| | | | | 716/110 |
| 9,460,258 | B2 | 10/2016 | Peart et al. | |
| 10,372,860 | B2 | 8/2019 | Rashingkar et al. | |
| 2003/0139842 | A1* | 7/2003 | Regnier | G06F 30/33 |
| | | | | 700/182 |
| 2004/0003366 | A1 | 1/2004 | Suzuki | |
| 2007/0245281 | A1* | 10/2007 | Riepe | G06F 30/392 |
| | | | | 716/120 |
| 2009/0031269 | A1* | 1/2009 | Chen | G06F 30/392 |
| | | | | 716/119 |
| 2009/0144687 | A1 | 6/2009 | Andou | |
| 2009/0288054 | A1 | 11/2009 | Okamoto | |
| 2013/0091481 | A1 | 4/2013 | Su et al. | |
| 2014/0181764 | A1* | 6/2014 | Chapman | G06F 30/398 |
| | | | | 716/103 |
| 2014/0380259 | A1* | 12/2014 | Tuan | G06F 30/398 |
| | | | | 716/119 |
| 2019/0372753 | A1 | 12/2019 | Dorrendorf et al. | |

FOREIGN PATENT DOCUMENTS

| | | |
|---|---|---|
| JP | 2006277418 A | 10/2006 |
| JP | 2009134439 A | 6/2009 |
| WO | 2008004346 A1 | 1/2008 |

OTHER PUBLICATIONS

Mirhoseini, et al. "Chip Placement With Deep Reinforcement Learning" (arXiv:2004.10746v1 [cs.LG] Apr. 22, 2020, pp. 1-15.

Skouson, et al. "Netlist Analysis and Transformations Using SpyDrNet", pp. 40-47, Proc. of the 19th Python in Science Conf. (SCIPY Jan. 2020).

International Search Report and Written Opinion for International Application No. PCT/US2023/024150 dated Sep. 13, 2023. 18 pages.

Shi et al. Macro Block Based FPGA Floorplanning. VLSI Design, 1997. Proceedings., Tenth International Conference on Hyderabad, India Jan. 4-7, 1997, Los Alamitos, CA, USA, IEEE Comput. Soc, US, Jan. 4, 1997 (Jan. 4, 1997), pp. 21-26.

Notice of Grant for Japanese Patent Application No. 2023-577745 dated Nov. 18, 2025. 3 pages.

* cited by examiner

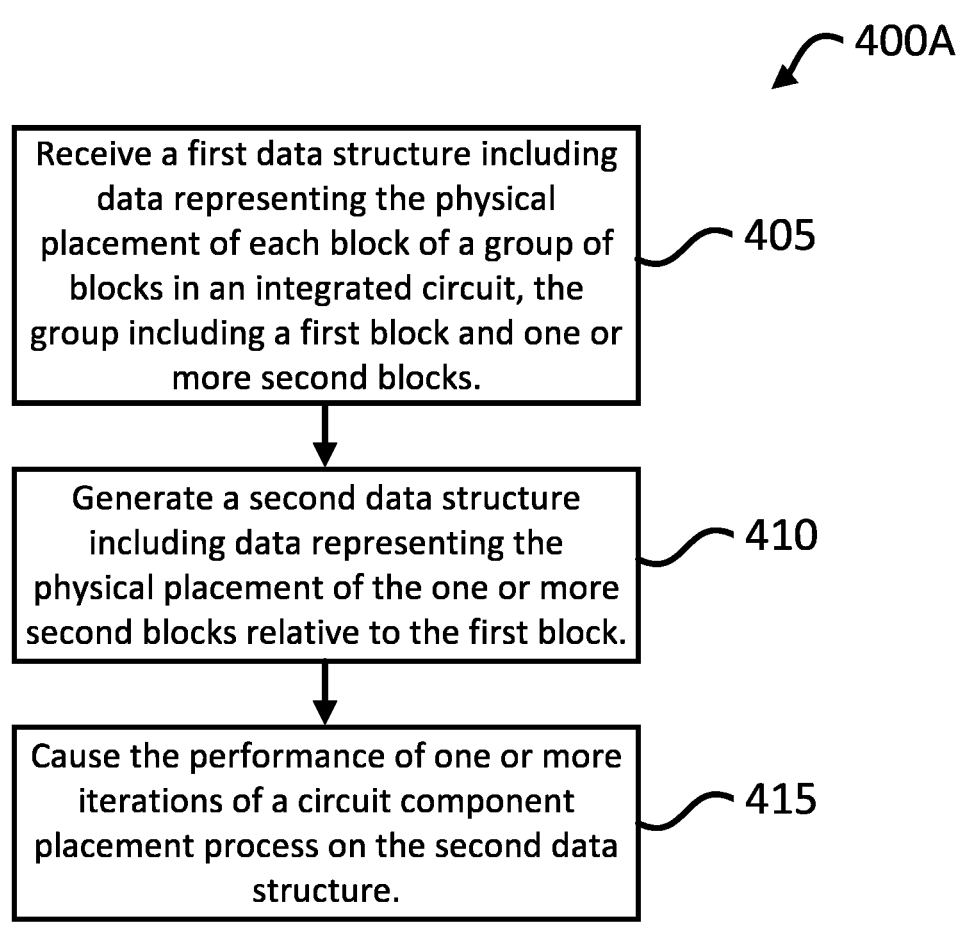

400A

Receive a first data structure including data representing the physical placement of each block of a group of blocks in an integrated circuit, the group including a first block and one or more second blocks. — 405

Generate a second data structure including data representing the physical placement of the one or more second blocks relative to the first block. — 410

Cause the performance of one or more iterations of a circuit component placement process on the second data structure. — 415

FIG. 4A

MULTIPLY-INSTANTIATED BLOCK MODELING FOR CIRCUIT COMPONENT PLACEMENT IN INTEGRATED CIRCUIT

BACKGROUND

Electronic design automation (EDA) technology relates to the design of integrated circuits ("ICs" or "chips"). One part of EDA is chip floor planning, in which the physical position of circuit components on the substrate for the chip is determined. The physical position of circuit components of an electronic design is often based on the optimization of desired physical characteristics for the IC on which the components are implemented. Desired physical characteristics, such as wire-length between components or density of components per square unit on the chip face, are correlated with improved chip performance and reduced power consumption. A placement engine is a device or software for planning the physical position of circuit components and their respective interconnections, in accordance with these and other desired physical characteristics.

As circuit components and potential interconnections on modern chips can range into the billions, modern placement engines struggle with identifying optimal placement of the circuit components. Some placement engines are implemented using a divide-and-conquer approach and approach placement modeling by representing chips as a collection of independent functional units or blocks.

Modern circuit component placement systems typically place circuit components of the blocks without necessarily considering how the represented blocks are instantiated and connected to one another. In instances where the placement engine is configured to encode information about a block's instantiation or its interconnected neighbors, each block is uniquified, such that separate instances of blocks are represented as separate nodes in a graph representing the chip floorplan. Thus, uniquification causes the nodes in chip-level graphs to increase at a rate that makes placement optimization computationally intractable at scales demanded by modern chip design practices.

BRIEF SUMMARY

Aspects of the disclosure provide for eliminating or reducing uniquification of blocks in a chip-level graph of a computer chip by reducing the size of the graph while still encoding block-specific information. For each group of blocks in a graph that is generated from a common template block, such as a multiply-instantiated block (MIB), a block is selected as a base block. The physical position of the base block is encoded in a reduced graph, and the physical positions of the remaining blocks are encoded as linear transformations of the physical position of the base block across the face of the chip. Each group of blocks instantiated from the same MIB is represented as a single instance, with instance-specific pin location information encoded as pin offsets in the added sub-graphs. Instance-specific information can also include the orientation of the block or pins of the block, e.g., whether the block is rotated or flipped. Instance-specific information can also include the physical location of the pins on the block, as well as interconnections between pins on the block and other circuit components. A system configured according to aspects of the disclosure can generate the reduced graph to further encode information, such as instance-specific pin connections, as sub-graphs as part of the chip-level graph. The reduced graph can be fed into a device configured to perform a circuit component placement process to identify the physical position of circuit components for blocks in the chip in accordance with one or more objectives, such as reducing wire-length for interconnections of the circuit components.

The reduced graph is represented using less data than the original graph, which can reduce the computational resources required to process the graph and identify the physical position of components within each block of the chip. The addition of sub-graphs to encode instance-specific information of the de-uniquified blocks (also called "block-specific") can still result in a smaller overall chip-level graph than a graph representing each block as a uniquified instance. The physical position of circuit components within each block can be identified as part of a circuit component placement process. The circuit component placement process can be performed to improve the performance of the chip according to one or more desired objectives, such as reducing the wire-length of interconnections on the chip.

One aspect of the disclosure provides for a method including: receiving, by one or more processors, a first data structure including data representing the physical position of each block of a group of blocks in an integrated circuit (IC), the group of blocks including a first block and one or more second blocks, each block including one or more respective circuit components; generating, by the one or more processors, a second data structure, wherein the second data structure includes data representing the physical position of the one or more second blocks relative to the first block; and at least partially causing, by the one or more processors, the performance of one or more iterations of a circuit component placement process on the second data structure, wherein the circuit component placement process includes generating data representing the physical position of circuit components of a block represented by the second data structure in accordance with one or more objectives.

Other implementations of this aspect include corresponding computer systems, apparatus, and non-transitory computer-readable storage media recorded on one or more memory devices, each configured to perform the actions of the methods.

The foregoing and other implementations can each optionally include one or more of the following features, alone or in combination. At least one implementation includes all the following features in combination.

Generating the second data structure includes, for each circuit component of a second block, generating data representing the physical position of the circuit component relative to the physical position of a respective circuit component in the first block and one or more offset values.

The physical position of each block is represented as a respective position of a floorplan of the integrated circuit; and wherein generating the second data structure includes: selecting the first block from the blocks in the group of blocks; and for each second block, generating data representing the physical position of the second block, the data including a respective linear transformation of the physical position of the first block along the floorplan of the integrated circuit.

The method further includes generating the second data structure, including: generating, as part of the second data structure, data representing block-specific interconnections for the one or more second blocks, a block-specific interconnection representing a unique connection between a second block and another circuit component.

The method further includes receiving the one or more offset values, the one or more offset values at least partially based on the physical dimensions of the blocks in the group;

and receiving, for each second block, the respective linear transformation of the physical position of the second block relative to the physical position of the first block and the one or more offset values.

A linear transformation represented in the generated data includes at least one of: a horizontal translation along the floorplan, a vertical translation along the floorplan, a rotation along the floorplan, and a mirror-flip along the floorplan.

The first data structure is generated at least partially using the circuit component placement process, the circuit component placement process including updating the data representing the physical position of blocks in the first data structure in accordance with the one or more objectives.

The one or more objectives include at least one of: increasing performance of the integrated circuit according to one or more predetermined metrics; reducing the power requirement of the integrated circuit; reducing the length of interconnections between circuit components on the integrated circuit; and reducing the physical area of the integrated circuit on a substrate on which the integrated circuit is implemented.

Each block of the group of the group of blocks represented by the first data structure is a uniquified instance of a template block.

The template block is one of a multiply-instantiated block (MIB), one or more intellectual property (IP) blocks, a memory macro; and one or more logic gates.

BRIEF DESCRIPTION OF THE DRAWINGS

FIG. 4A is a flow diagram of an example process for de-uniquifying a data structure of uniquified instances of MIBs, according to aspects of the disclosure.

DETAILED DESCRIPTION

Overview

Figure 1:
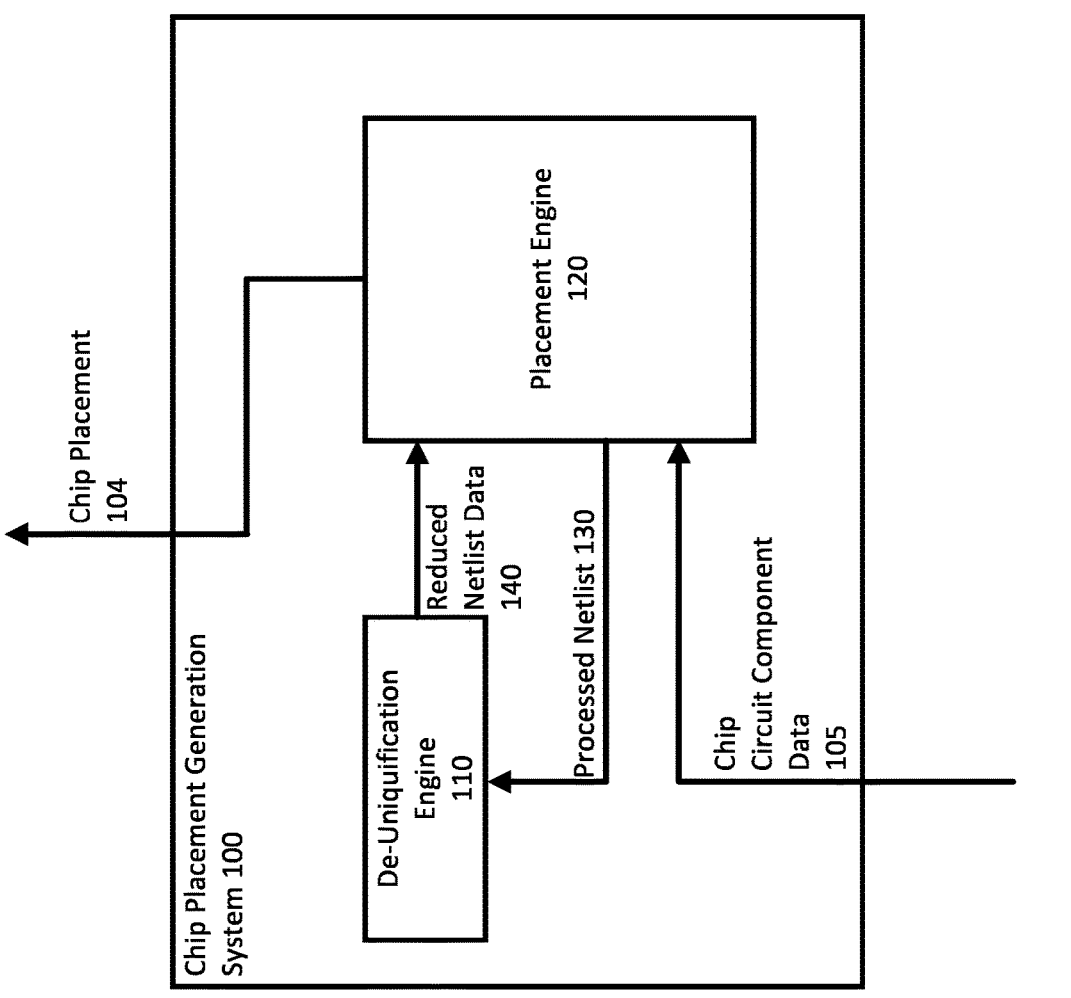
FIG. 1 is a block diagram of an example chip placement generation system with a block de-uniquification engine.

Aspects of the disclosure are directed to reducing the size of a chip-level graph representing the physical position of circuit components of an integrated circuit ("IC" or "chip"), to facilitate the performance of circuit component placement optimization processes on the graph. Chip-level graphs are data structures that represent the physical arrangement of circuit components of an IC. The placement of physical components of an IC can be represented as blocks on a floorplan, referring to the face or surface of the IC when fabricated on a substrate, such as a wafer. Blocks of circuit components can be generated from a common template block, such as a multiply-instantiated block (MIB) and may vary from instance-to-instance. To represent instance-specific differences from block-to-block, blocks of a chip-level graph are uniquified or duplicated in the graph with the often-minor variations noted. Aspects of the disclosure provide for eliminating uniquified instances while not losing instance-specific differences. De-uniquification in this disclosure refers to a process in which uniquified instances of a template block are eliminated from a chip-level graph.

During chip design, particularly in very-large-scale integration (VLSI), the placement of circuit components on or within a chip may have a significant effect on the optimization of certain physical characteristics of the chip. Example physical characteristics that may be improved by optimizing the physical position of circuit components includes reducing wire-length of interconnects between components, increasing component density, e.g., increasing the quantity of components that can be placed on the same chip, etc.

A chip-level graph is a model representation of a chip. Nodes of the graph are blocks or other circuit components, and edges between nodes are interconnections. As modern chip design can include millions or even billions of components, a chip-level graph for a modern chip can also be large, with many nodes and an exponential quantity of edges for interconnections between the nodes. A block can be a logical abstraction of a quantity of circuit components, such as a processing unit, a memory module, etc. Each block can be represented as its own internal graph, which can be large, e.g., millions of nodes in size. The sheer size of a chip-level graph can make performing processes for optimizing the arrangement of circuit components within a block difficult or computationally intractable.

The increase in the size of a chip-level graph is due in part to the uniquification of instances of a common template block, such as an MIB. An MIB is a template block of circuit components representing a functional unit on or within a chip as a logical block. Example functional units that may be represented by an MIB include computation units, memory units, etc. An instance of an MIB is a block that is generated from the MIB, which may be identical to the MIB, or deviate from the design of the MIB in some way. Example deviations include different locations or orientations within a chip, or interconnect with different blocks of the chip in different locations. Uniquified instances are treated as separate nodes in a chip-level graph, even if the differences between instances are small, e.g., a block is a shifted version of another block within a chip, where all circuit components of the block are shifted the same way.

Aspects of the disclosure provide for avoiding uniquification by having only a single graph representation for an MIB or another template block. Rather than uniquified instances for each MIB, a single block—referred to as a base block in this specification—is selected for each group of blocks corresponding to a respective MIB.

A system configured according to aspects of the disclosure can identify, based on fixed offsets such as the physical dimensions for blocks in a group of blocks, a linear transformation for each of the other blocks in the group. Treating the chip as a floorplan of blocks, the physical position of a block can be described as a linear transformation, e.g., a translation, a rotation, a mirror-flip, etc., of a selected base block. For example, the physical position of circuit components in a first block abutting or adjacent to a base block can be represented by the physical position of corresponding components in the base block, shifted across the face or surface on or within a chip by a fixed offset. The physical position of a second block abutting or adjacent to the first block can be represented by the physical position of the base block, shifted across the face or surface of the chip by twice the fixed offset.

A reduced chip-level graph generated according to aspects of the disclosure encodes each block of a group of blocks with a common template block relative to a respective base block for the group. The fixed offsets, e.g., the offsets for translating or rotating the physical position of the base block, can be predetermined, and the system can identify each block with a common template block in a group and a corresponding linear transformation for representing the block. Because blocks common to a template block have the same circuit components, the physical position of a circuit component in a block can be represented as a linear transformation of the placement of a base circuit components of a corresponding base block.

Instance-specific or block-specific information, such as block-to-block interconnections and their pin positions at a block can be encoded as a separate sub-graph. For example, given two blocks $a_{i1}$ and $a_{i2}$ from a common MIB A, the blocks may have different connections to different neighboring blocks through different pins defined in MIB A. The system as described can generate a sub-graph to represent the interconnections for each block of a group and add the sub-graph to data representing the node in the chip-level graph for the group's base block.

Adding a graph of instance-specific interconnections is computationally less taxing, e.g., requiring less memory or processing cycles to compute, than separately maintaining uniquifying instances of each template block. The preserved instance-specific information can be accessed later in a circuit component placement process that uses the information as part of optimizing the placement of circuit components within a block on a chip. During the circuit component placement process, all instances of a template block are treated as a single instance, as opposed to separate instances with minor differences and redundant information.

Aspects of the disclosure provide for at least the following technical advantages. By reducing the size of a chip-level graph through de-uniquification as described herein, a circuit component placement process receiving the reduced chip-level graph can be performed more efficiently, e.g., measured in fewer clock cycles or memory used, and/or in reduced wall-clock time to identify an improved physical position of the circuit components. De-uniquifying chip-level graphs that are otherwise computationally infeasible to optimize by circuit component placement broadens the class of chip design candidates. Increasing the quantity of designs that may be optimized can result in the identification of improved circuit designs, e.g., for chips that are more resource-efficient or that perform better compared to previous chips.

Aspects of the disclosure can be incorporated into existing chip design pipelines, for example as an intermediate step between improving component placement at a block level of the chip and improving component placement within blocks of the chip. De-uniquifying chip-level graphs prior to placement optimization can be a net positive for saving computational resources, which can be directed to fast chip prototyping, chip-scale performance optimization and estimations, and other improvements to an existing chip design pipeline. These and other improvements scale with the size of chip designs and the quantity of MIBs from which blocks are instantiated. The more MIBs and instances of MIBs, the larger the performance improvement and resource reduction relative to processing chip-level graphs with uniquified instances.

Example Systems

FIG. 1 is a block diagram of an example chip placement generation system 100 with a block de-uniquification engine 110. The chip placement generation system 100 can be implemented as one or more computer programs on one or more computers in one or more positions.

The system 100 is configured to receive chip circuit component data 105 for a computer chip to be manufactured, such as a very large-scale integration (VLSI) chip like central processing units (CPUs) or hardware accelerators such as tensor processing units (TPUs) for machine learning acceleration. The computer chip can include integrated circuit components, such as transistors, resistors, capacitors, etc., depending on the function of the chip. For example, the chip can be a special-purpose chip, such as an application-specific integrated circuit (ASIC) or a graphics processing unit (GPU), for machine learning computations, video processing, cryptography, or other compute-intensive functions.

Chip circuit component data 105 can include a specification of different circuit components that form part of the chip design. A circuit component is any component that can be part of an integrated circuit. Example components include processing units, memory, wires, busses, individual or collections of circuits grouped together to perform a function, etc. A block is a logical organization of one or more circuit components. The chip circuit component data 105 can include a netlist or some other data structure representing a logical or physical organization of circuit components for a chip design. A netlist is a data structure that can at least partially describe a chip-level graph and its sub-graphs. A block can include different pins or other means of connecting to interconnects, such as wires, cables, or busses, for connecting and communicating data or power to different components or other devices of a system.

Blocks can include macro components ("macros") corresponding to large blocks of IC components, e.g., static random-access memory (SRAM) or other memory blocks. As another example, the nodes representing macro components can include hard macros that are made up of a fixed number of standard cells, such as a macro that is made up of a fixed number of instances of a register file. In some examples, macros can include one or more nodes that each represent a phase-locked loop (PLL) circuit to be placed on the chip. In some examples, the macros can include sensors to be placed on the chip. Blocks can also be Intellectual Property (IP) blocks.

Blocks can be instances of a common template block, such as an MIB. An MIB can define a set of circuit components that are often reused in a chip design. Example MIBs include computation units, such as matrix multipliers or vector multipliers, accumulators, systolic arrays, etc. A block generated from a template block, such as an MIB, is an instance of that template block. Multiple blocks generated from the same template block are said to share that template block in common.

When multiple instances share a common template block and are represented as individual blocks in a netlist or chip-level graph, those instances are considered uniquified. Uniquified blocks may differ, for example, in different pins that are connected to different blocks, as described in more detail herein with reference to FIG. 3A.

The chip circuit component data 105 can be raw data or a processed output generated from software and/or hardware for generating chip designs. For example, the chip circuit component data 105 can be generated using a programming language or framework for specifying physical hardware designs as logic circuits. The programming language or framework can convert certain programming languages, such as C or C++, into hardware description languages (HDLs), such as Verilog or VHDL, for specifying the circuit components of the computer chip. The chip circuit component data 105 can be the product of multiple conversion steps, for example converting high-level source code into a behavioral or digital logic-based description. Logic-based descriptions can be even further converted to a specification of the logic gates and other primitive circuits needed to implement the described logic. In general, any of a variety of tools and technologies for abstracting hardware design to various degrees may be used to generate the component data 105.

The system 100 can receive the chip circuit component data 105 in any of a variety of ways. For example, the system 100 can receive the chip circuit component data 105 as an upload from a remote user of the system 100 over a data communication network, such as using an application programming interface (API) made available by the system 100. In some cases, the system 100 can then provide the outputted chip placement 104 to the remote user through the API provided by the system 100, such as for use in fabricating a chip according to the outputted chip placement 104. As another example, the system 100 can be part of an electronic design automation (EDA) software tool and can receive the chip circuit component data 105 from a user of the tool or from another component of the tool.

The system 100 can receive a netlist representing the physical position of a group of circuit components on an integrated circuit. The netlist can be part of the chip circuit component data 105. A netlist is data describing the connectivity of the integrated circuit components of the computer chip. A netlist can correspond to a description of connectivity of an electronic circuit, such as a list of circuit components in a circuit and a list of nodes to which the circuit components are connected. For example, the nodes representing memory macros can include nodes that each represent a corresponding instance of an SRAM. As another example, the nodes representing memory macros can include hard macros that are made up of a fixed number of standard cells, such as a memory macro that is made up of a fixed number of instances of a register file. In some examples, the nodes representing memory macros can include one or more nodes that each represent a phase-locked loop (PLL) circuit to be placed on the chip. In some examples, the nodes representing memory macros can include one or more nodes that each represent a sensor to be placed on the chip.

Each node can correspond to a respective non-overlapping subset of the integrated circuit components. For each node, the netlist can identify, which other nodes (if any) the node is to be connected to by one or more wires in the manufactured computer chip. Each node in the netlist can also correspond to a block. A netlist can at least partially define a graph representing the physical position of blocks and other circuit components on the floorplan of the integrated circuit. Circuit components inside a parent block can be represented as sub-graphs within the node representing the parent block. Uniquified instances of a template block appear as separate nodes in a graph.

Placement engine 120 can receive the chip circuit component data 105. The placement engine 120 can generate a netlist from the component data 105 if a netlist is not already provided. The placement engine 120 is configured to perform a circuit component placement process, in which blocks are placed on the floorplan of the integrated circuit in accordance with one or more objectives for improving performance of the integrated circuit. Example objectives include reducing power draw, minimizing the wire length of interconnects, etc. A circuit component placement process can refer to any process for generating data describing a physical position of blocks that improves the resulting physical chip according to one or more specified objectives. Example techniques can include constraint-based methods, graph-based methods, and tree-based methods.

The placement engine 120 can be configured to perform iterations of a circuit component placement process until meeting some stopping criteria. The stopping criteria can include, for example, determining that a predetermined minimum improvement in accordance with the objectives have not been met. Another example of a stopping criterion is a maximum clock-time allotment or maximum computing resource allocation, e.g., a maximum quantity of processing cycles to allocate performing the circuit component placement process.

Aspects of the disclosure include a method which may be a downstream process to a first block of a circuit component placement process. Circuit components on or within a chip can be modeled as sharing a floorplan. In the floorplan, different blocks or other circuit components are placed according to some objective, for example to minimize or reduce wasted space on the floorplan, referred to sometimes as dead space. The first step may be a block-level placement, in which blocks are placed on the integrated circuit floorplan. The second step may be a sub-component-level placement, in which circuit components of a block ("sub-components") are placed within the portion occupied by a parent block of the circuit components on the floorplan.

Prior to performing the second block of the placement process, the placement engine 120, as described herein, can generate a processed netlist 130 and pass the netlist to a de-uniquification engine 110. In some examples, the chip circuit component data 105 includes a processed netlist that has already been through a block-level placement process.

The system 100 is configured to output a computer chip placement 104 that places some or all the blocks in the reduced netlist 140 at a respective position on the surface of the computer chip. The outputted chip placement 104 can identify a respective position on the surface of the computer chip for some or all the nodes in the reduced netlist 140 corresponding to the integrated circuit components represented by the nodes.

Figure 2:
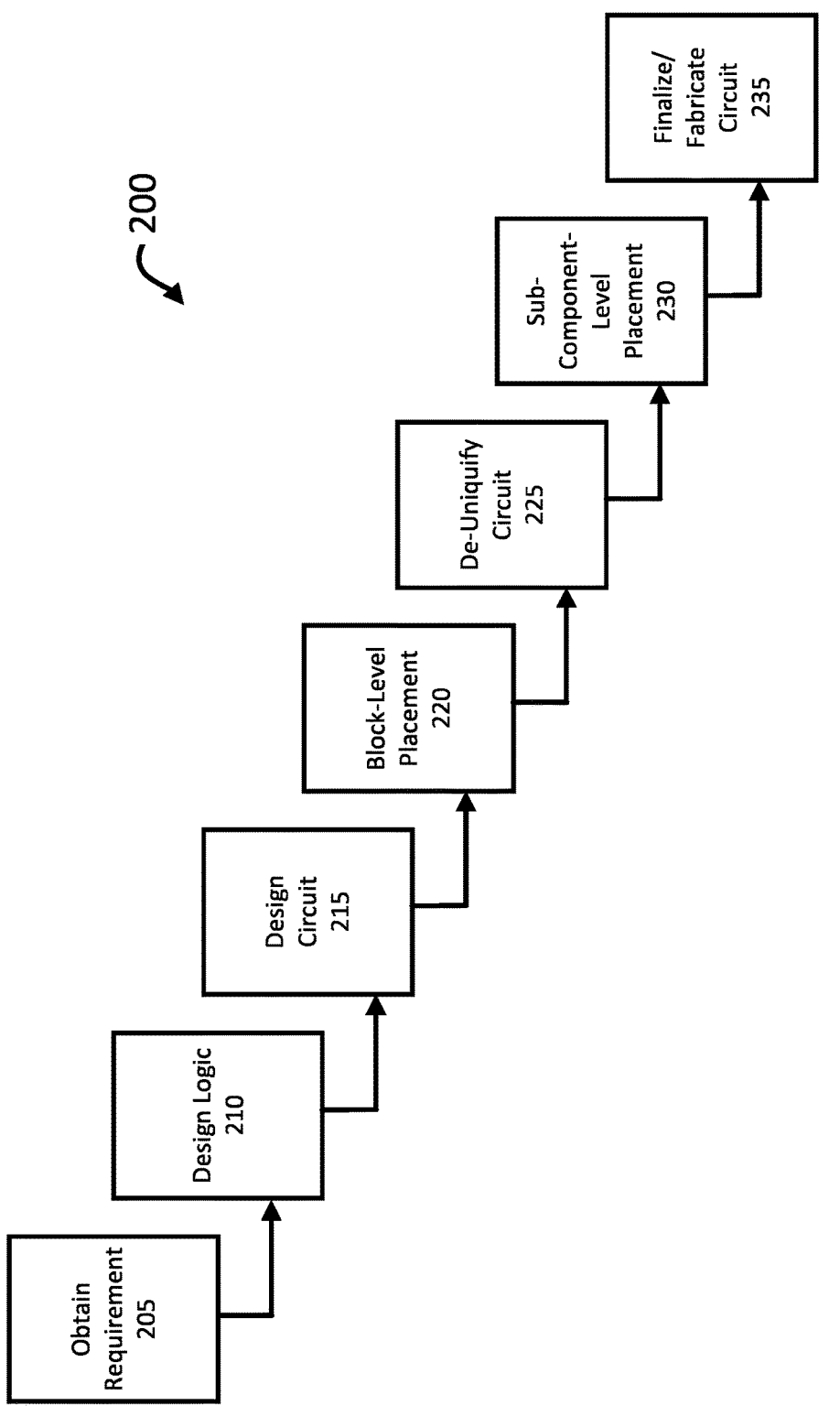
FIG. 2 is a flow diagram of an example chip design pipeline with de-uniquification, according to aspects of the disclosure.

FIG. 2 is a flow diagram of an example chip design pipeline 200 with de-uniquification, according to aspects of the disclosure. In some examples, the system 100 can be part or all the pipeline 200. In some examples, the system 100 is part of different pipelines, which may include the same, more, fewer, or various stages as part of the design and fabrication of a chip.

At block 205, the requirements of the chip are obtained. The requirements can specify, for example, what function a chip is to perform, and whether there are any operating constraints, e.g., power limitations, maximum latency in communicating data to and from a requesting device, etc. At block 210, the logic for implementing the requirements is designed. The logic can be designed, for example, as part of the system 100 configured to receive operating requirements and determine the logic and requirements for fabricating a chip satisfying those requirements. At block 215, the circuit is designed with the required components to implement the designed logic.

At block 220, the system 100 can perform one or more iterations of a block-level placement process. As described with reference to FIG. 1, the circuit component placement process can be broken up into at least two stages, block-level at block 220 and sub-component-level at block 230. After block 220, the system can generate a netlist with blocks of the integrated circuit arranged to improve the performance or power usage in accordance with one or more objectives.

At block 225, the system 100 can perform a process to de-uniquify the netlist processed at block 220. For example, and as described herein, the system can perform the process 400A to remove uniquified instances of a template block and represent each instance with a single representation. The resulting reduced netlist can be provided as input to a device configured for the sub-component level placement, indicated by block 230.

Performing the sub-component level placement at block 230 can result in a netlist that has blocks with circuit components placed in accordance with one or more objectives, e.g., reducing wire-length. The resulting netlist can be used as part of a finalize/fabrication circuit step as indicated at block 235, to fabricate a physical chip from the final design.

Figure 3A:
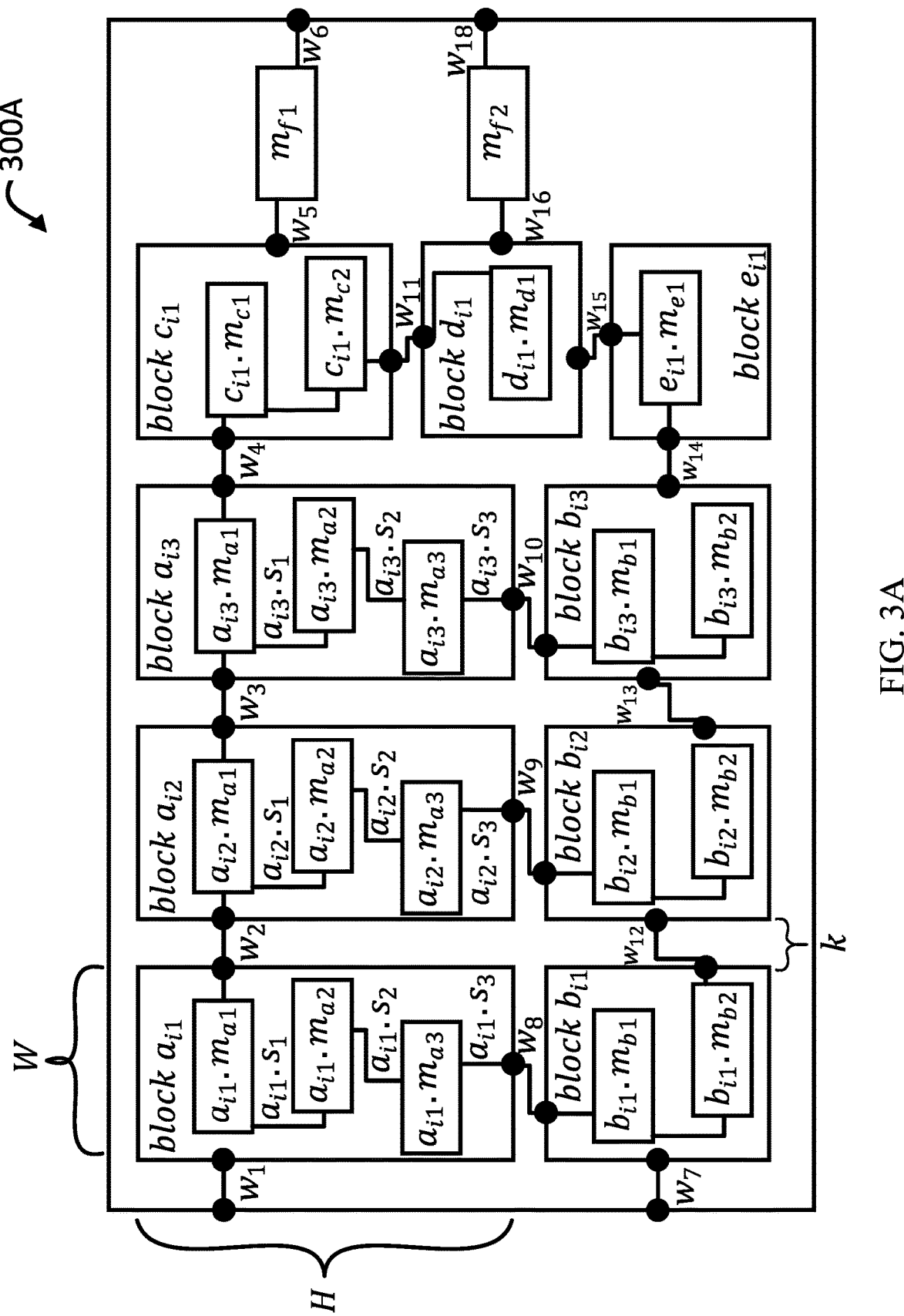
FIG. 3A is an example chip-level graph of a chip, in accordance with aspects of the disclosure.

FIG. 3A is an example chip-level graph 300A of a chip 301A, in accordance with aspects of the disclosure. The chip 301A includes blocks each instantiated from one of five MIBs: A, B, C, D, and E. For clarity, when referring to a specific circuit component in a block instantiated from an MIB, both the block and sub-circuit component reference numeral will be used. For example, circuit component $a_{i1}.m_{a1}$ refers to the circuit component $m_{a1}$ in the block $a_{i1}$. Circuit component $a_{i1}.m_{a1}$ is distinct from, for example, circuit component $a_{i2}.m_{a1}$, which refers to the component $m_{a1}$ in the block $a_{i2}$.

The graph 300A includes three blocks $a_{i1}$, $a_{i2}$, $a_{i3}$ instantiated from MIB A that each include circuit components $m_{a1}$, $m_{a2}$, and $m_{a3}$. The graph 300A also includes three blocks $b_{i1}$, $b_{i2}$, $b_{i3}$ instantiated from MIB B that each include circuit components $m_{b1}$ and $m_{b2}$. Block $c_{i1}$ is instantiated from MIB C and includes two circuit components $m_{c1}$ and $m_{c2}$. Block $d_{i1}$ is instantiated from MIB D and includes circuit component $m_{d1}$. Block $e_{i1}$ is instantiated from MIB E and includes circuit component $m_{e1}$. Circuit components $m_{f1}$ and $m_{f2}$ are also shown, which are not generated from template blocks but show that a chip-level graph can include a mixture of instantiated and non-instantiated circuit components.

When blocks on a chip are positioned in a predetermined and fixed position relative to one another, the position of a circuit component internal to a block can be expressed as a corresponding internal component position in a different block instantiated from the same MIB. This is possible because components internal to blocks instantiated from the same MIB have the same relative position. For example, if blocks $a_{i1}$, $a_{i2}$, $a_{i3}$ have the same width W and the blocks abut one another on the chip as shown in the graph 300A, then the position of circuit component $m_{a1}$ in block $a_{i2}$ can be represented using the position of the circuit component $m_{a1}$ in block $a_{i1}$ and the offset W. The offset W corresponds to the width of a block in the chip. Offset H corresponds to the height of blocks instantiated from MIB A. One example formulation of the physical position of component $a_{i2}.m_{a1}$ can be:

$$a_{i2}.m_{a1}=a_{i1}.m_{a1}+W \tag{1}$$

The offset W is the fixed offset between block $a_{i1}$ and block $a_{i2}$. The addition of the offset W can be predefined to represent a horizontal translation, e.g., a translation to the right relative to the top-left corner of the graph 300A. In other examples, addition, subtraction, or other operations can be defined to represent translations in different directions relative to a fixed point of the graph 300A.

As another example, the position of circuit component $m_{a1}$ in block $a_{i3}$ can be expressed using the position of the circuit component $m_{a1}$ in block $a_{i1}$ and twice the offset W. Further, block $a_{i3}$ is a mirror reflection of the block $a_{i1}$, across an imaginary vertical axis. To encode the reflection, the linear transformation representing the position of circuit component $a_{i3}.m_{a1}$ can be inverted. One example formulation can be:

$$a_{i3}.m_{a1}=2W-a_{i1}.m_{a1} \tag{2}$$

The offset 2 W is the fixed offset between $a_{i1}$ and $a_{i3}$. In some examples, such as shown in FIG. 2, the blocks may be a fixed distance apart and not abut one another. In those examples the width W can be the sum of the width of a block and the predetermined, fixed distance between each block, shown as k in FIG. 2. The distance k is often zero, to reduce dead space.

Although block $a_{i1}$ is chosen as the example base block in the formulations above, it is understood that other blocks can serve as the base blocks from which positions of circuit components of other blocks can be represented. For example, using block $a_{i2}$ as a base block, one example formulation for the position of circuit component $a_{i1}.m_{a1}$ can be:

$$a_{i1}.m_{a1}=a_{i2}.m_{a2}-W \tag{3}$$

Comparing formulations (1) and (3) illustrates that the precise transformation applied to represent the corresponding transformation of a circuit component can vary. For example, a horizontal translation to the right can be represented by adding the fixed offset (+). A horizontal translation to the left can be represented by subtracting the fixed offset (−). As shown in formulation (4), a mirror-flip can be represented as an inversion of the position of the circuit component. In some examples, other operations are used to define the several ways to move the position of a circuit component across a chip.

Wires connecting different circuit components of non-base blocks can also be represented as a function of wires of a base block. The graph 400A shows wires $w_1$, $w_2$, $w_3$, $w_4$, $w_5$, $w_6$, $w_7$, $w_8$, $w_9$, $w_{10}$, $w_{11}$, $w_{12}$, $w_{13}$, $w_{14}$, $w_{15}$, $w_{16}$, $w_{17}$, $w_{18}$. Wires $w_1$ and $w_8$ are connected to block $a_{i1}$, which is the base block in one example. The physical position of wire $w_{10}$ connected to block $a_{i3}$ can be represented as a linear transformation of the physical position of the wire $w_8$ and the offset W. One example formulation of the position of the wire $w_{10}$ can be:

$$w_{10}=w_8+2W \tag{4}$$

The system 100 is configured to receive linear transformations for each circuit component on or within a chip. For example, the system can traverse a chip-level graph to identify groups of blocks that are instantiated from a common template block. The system can select a block from a group as the base block. To select the base block, the system can select randomly from blocks in a group. In some examples, to select the base block, the system can identify the most centrally located block of the group, e.g., the group with the smallest graph distance on average from each of the other blocks in the group. The distance metric for determining graph distance can be the degree of separation the base block has from other blocks. In some examples, the base block is predetermined. e.g., the first instance of each template block.

Referring to FIG. 3A, compare the structure of a chip-level graph before and after de-uniquification, e.g., before and after performing the process 400A. One example formulation of the graph 300A can be (N, E), where:

N:

$\{a_{i1}.m_{a1},\ a_{i1}.m_{a2},\ a_{i1}.m_{a3},\ a_{i2}.m_{a1},\ a_{i2}.m_{a2},\ a_{i2}.m_{a3},$
$a_{i3}.m_{a1}, a_{i3}.m_{a2}, a_{i3}.m_{a3},$ $\quad b_{i1}.m_{b1}, b_{i1}.m_{b2}, b_{i2}.m_{b1}, b_{i2}.m_{b2}, b_{i1}.m_{b3}, b_{i3}.m_{b2},$ $\quad c_{i1}.m_{c1}, c_{i1}.m_{c2}$ $\quad d_{i1}.m_{d1}$ $\quad e_{i1}.m_{e1}$ $\quad m_{f1}$ $\quad m_{e1}\},$ and

N:

$\{w_1, w_2, w_3, w_4, w_5, w_6, w_7, w_8, w_9, w_{10}, w_{11}, w_{12}, w_{13},$
$w_{14}, w_{15}, w_{16}, w_{17}, w_{18}$ $\quad$ Interconnects($a_{i1}$), Interconnects($a_{i2}$), Interconnects($a_{i3}$), $\quad$ Interconnects($b_{i1}$), Interconnects($b_{i2}$), Interconnects($b_{i3}$), $\quad$ Interconnects($c_{i1}$), Interconnects($c_{i2}$), Interconnects($d_{i1}$), $\quad$ Interconnects($e_{i1}$)}, where Interconnects(x) is the set of all interconnects of circuit components in block x. For example, Interconnects ($a_{i1}$) is equivalent to $\{a_{i1}.s_1, a_{i1}.s_2, a_{i1}.s_3\}$.

Each block in (N, E) is a uniquified instance, and the graph (N, E) consumes more space than a reduced graph representation generated according to aspects of the disclosure. A reduced graph representation (N', E', L) can retain the block information for the base blocks, leaving the rest of the blocks to be represented as a respective linear transformation. One example formulation of N' can be:

N':

$\{a_{i1}.m_{a1}, a_{i1}.m_{a2}, a_{i1}.m_{a3}, a_{i2}.m_{a1},$ $\quad b_{i1}.m_{b1}, b_{i1}.m_{b2},$ $\quad c_{i1}.m_{c1}, c_{i1}.m_{c2}$ $\quad d_{i1}.m_{d1}$ $\quad e_{i1}.m_{e1}$ $\quad m_{f1}$ $\quad m_{e1}\},$ In N', only the base blocks are encoded, i.e., $a_{i1}$, $b_{i1}$, $c_{i1}$, $d_{i1}$, $e_{i1}$. Circuit components $m_{f1}$ and $m_{e1}$ are also encoded, as they are instantiated only once in the circuit represented by the graph 300A.

One formulation for E' can be:

N':

$+\{w_1, w_2, w'_3, w'_4, w_5, w_6, w_7, w_8, w'_9, w'_{10}, w_{11}, w_{12},$
$w'_{13}, w'_{14}, w_{15}, w_{16}, w'_{17}, w_{18},$ $\quad$ Interconnects($a_{i1}$), $\quad$ Interconnects($b_{i1}$), $\quad$ Interconnects($c_{i1}$), $\quad$ Interconnects($d_{i1}$), $\quad$ Interconnects($e_{i1}$)}

In E', wires $w_1$, $w_2$, and $w_8$ are wires correspond to the base block $a_{i1}$, wires $w_7$ and $w_{12}$ correspond to base block $b_{i1}$, wires $w_5$ and $w_{11}$ correspond to base block $c_{i1}$, wire $w_{16}$ corresponds to base block $d_{i1}$, wire $w_{15}$ corresponds to block $e_{i1}$, wire $w_6$ corresponds to circuit component $m_{f1}$ and wire $w_{18}$ corresponds to block $m_{e1}$. Wires $w'_3$, $w'_4$, $w'_9$, $w'_{13}$, $w'_{14}$, and $w'_{17}$ correspond to non-base blocks, and are represented as linear transformations of corresponding base block wires, as described with reference to FIG. 3A. Instance-specific information about wires $w'_3$, $w'_4$, $w'_9$, $w'_{13}$, $w'_{14}$, and $w'_{17}$, including their pin locations, is specific to their respective blocks, and is used for position placement of circuit components of a block, as described herein. The reduced graph (N', E') maintains that instance-specific information while overall representing the graph 300A with less data than the graph representation (N, E).

The interconnects for each base block in E' include the interconnects for the blocks instantiated from the same MIB. Any unique interconnects between components in the same non-base block are also encoded as an interconnect for the base block. For example, if block $a_2$ had a unique interconnection between two circuit components, that interconnection would be represented in Interconnects($a_{i1}$).

The linear transformations L can be a list of linear transformations corresponding to each non-base block. For example, linear transformations L can include the transformations shown with reference to formulations (1), (2), and (4). In some examples, the linear transformations L can include values for a look-up table of predetermined transformations, e.g., horizontal translations, rotations, etc., that is encoded as part of the system 100. The fixed offsets used can be included as part of the linear transformations L, and/or be determined based on the block information for the base blocks. The block information can be encoded as part of the chip-level graph 300A and include offsets such as the width W, the height H, space between blocks k, etc. In some examples, the linear transformations may be predetermined. e.g., only include horizontal translations relative to the base block. In those examples, the linear transformations L may be empty.

Figure 3B:
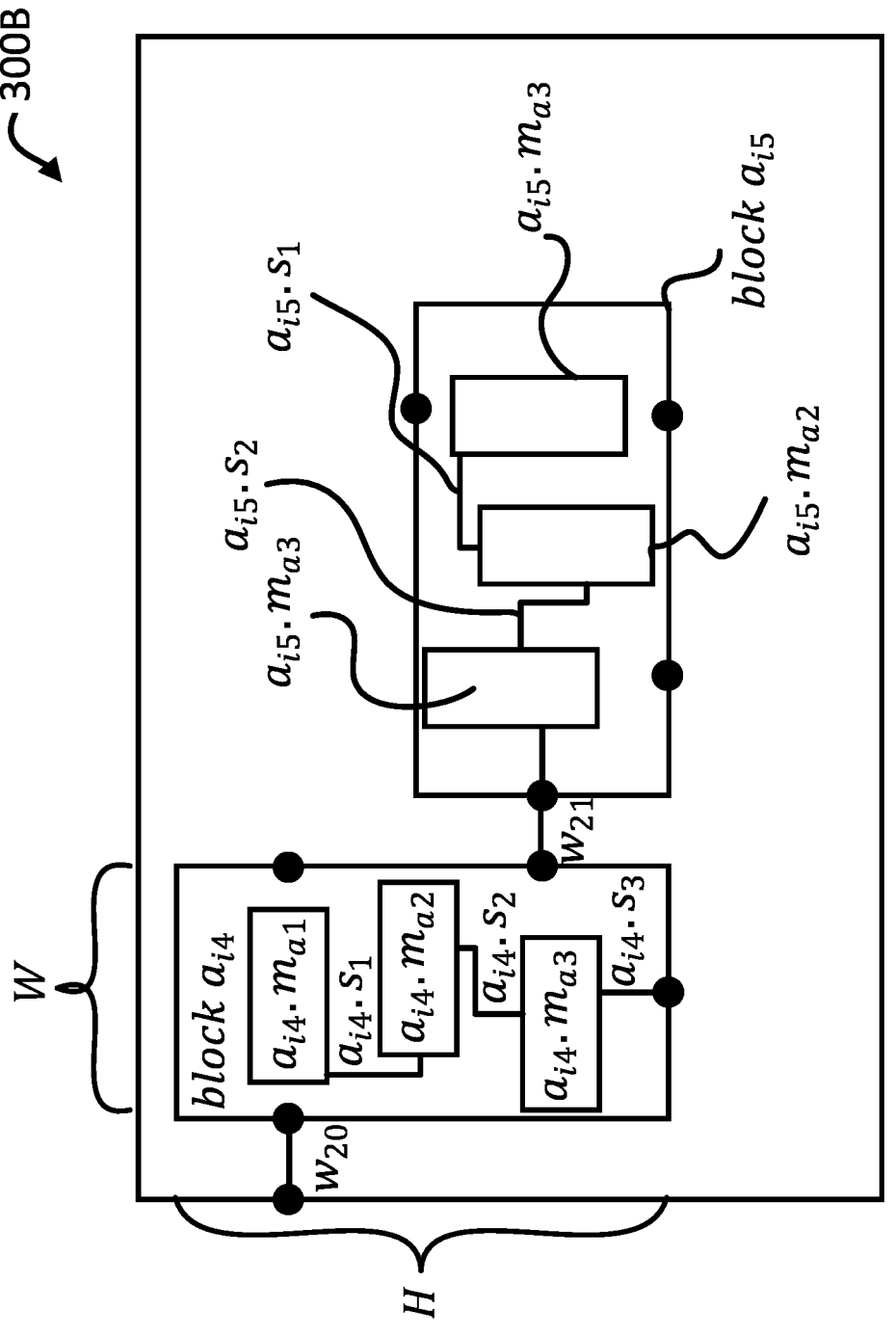
FIG. 3B is another example of a chip-level graph of a chip, in accordance with aspects of the disclosure.

FIG. 3B is another example chip-level graph 300B of a chip 301B, in accordance with aspects of the disclosure. Blocks $a_{i4}$ and $a_{i5}$ are instantiated from MIB A and through wires $w_{20}$, $w_{21}$. After the base block is selected, for each circuit component of each non-base block, the system can determine (i) the respective base circuit component in the base block, (ii) the value of the offset(s) for the circuit component, and (iii) the transformation of the position of the respective base circuit component and the value of the offset(s) to arrive at the position of the circuit component. As shown in examples 300A-C, different transformations include combinations of horizontal translations, vertical translations, mirror-flips, and rotations. The system can be configured to apply certain operations to represent the possible transformations, e.g., addition/subtraction for horizontal/vertical translation. In some examples, the linear transformations are determined by hand and provided to the system 100.

Linear transformations can also include rotations. The physical position of block $a_{i5}$ is rotated 90 degrees relative to the physical position of block $a_{i4}$. When block $a_{i4}$ is the base block, one formulation of the physical position of block $a_{i5}$ can be:

$$a_{i5} = a_{i4} + 90° \qquad (5)$$

In the example in formulation (5), the addition of a degree angle can be a clockwise rotation of the base block, and the subtraction of the degree angle can be a counter-clockwise rotation of the base block. Combinations of translations, mirror-flips, and rotations can be defined and applied in sequence. e.g., where the first term after the base block is a horizontal translation, the second term is a vertical translation, the third term is an angle of rotation, and whether the base block is multiplied by −1 indicating a mirror-flip. An example format for representing a physical position of a non-base block $x_2$ relative to a base block can $x_1$ can be:

$$x_2 = (\pm 1)x_1 \pm h_{offset} \pm v_{offset} \pm \text{rotation}_{offset} \qquad (6)$$

Where $h_{offset}$ is the horizontal offset, $v_{offset}$ is the vertical offset and rotation$_{offset}$ is the rotation offset (0-360 degrees).

Example Methods

FIG. 4A is a flow diagram of an example process 400A for de-uniquifying a data structure of uniquified instances of MIBs, according to aspects of the disclosure. The system can distribute chip floor planning operations across many different workers, which can include many different homogeneous or heterogeneous computing devices that perform computations using CPUs, GPUs, and/or ASICs. Some or all the steps in the process 400A can be performed in parallel by many different workers operating asynchronously from one another. The different workers can also operate synchronously to perform some or all the steps of the processes 400A and/or 400B in parallel.

A system of one or more processors can receive a first data structure including data representing the physical position of each block of a group of blocks in an integrated circuit, the group including a first block and one or more second blocks, according to block 405. For example, the system 100 can perform the process 400A. Although the process 400A is described with reference to a single group of blocks, the process 400A can be repeated for each of multiple groups of blocks in a first data structure such as a chip-level graph.

The first data structure can be a chip-level graph or some other data structure representing the physical position of blocks or other circuit components of a chip design. For example, the first data structure can be netlist data 130 or chip circuit component data 105 as shown and described with reference to FIG. 1.

The system generates a second data structure including data representing the physical position of the one or more second blocks relative to the first block, according to block 410.

Figure 4B:
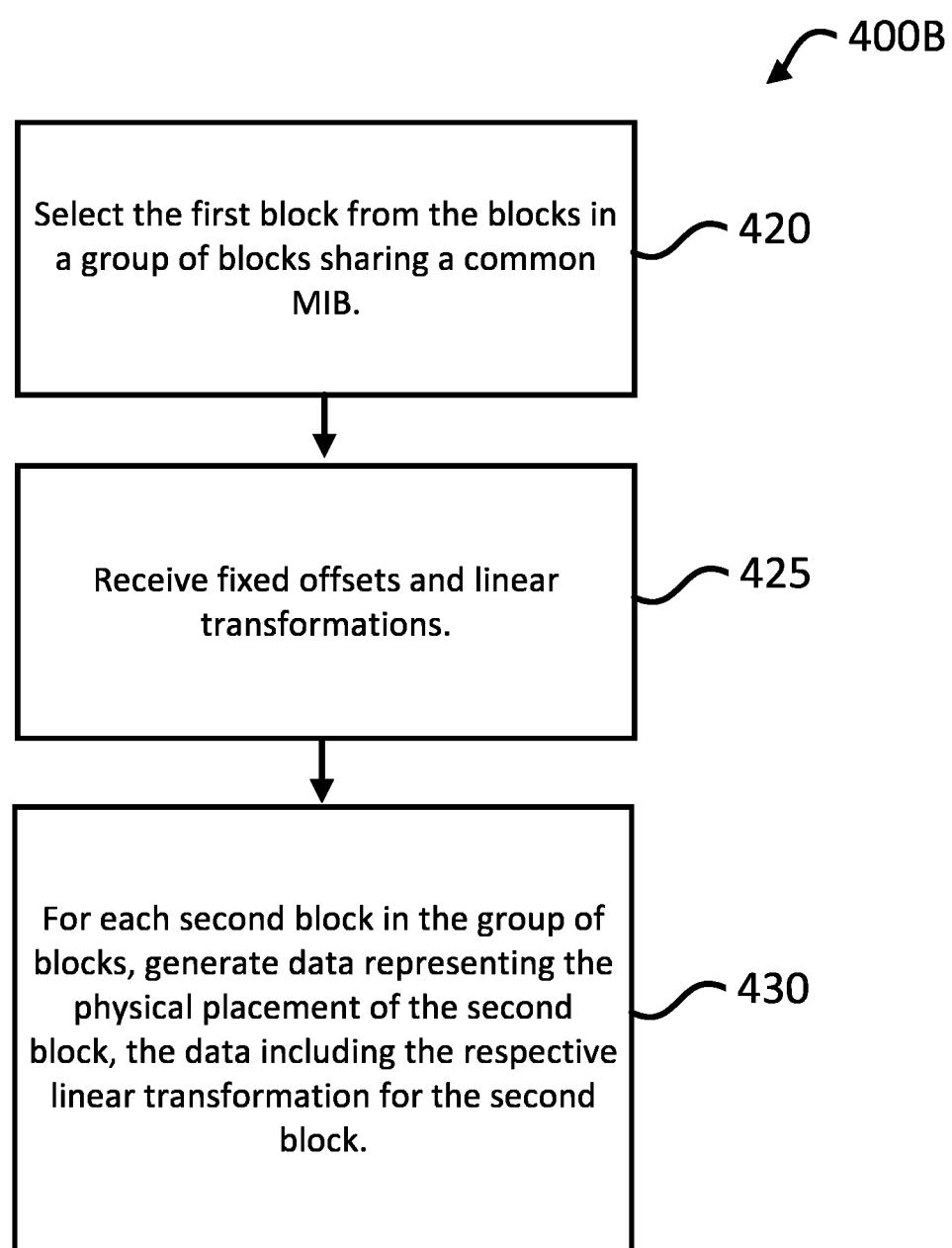
FIG. 4B is a flow diagram of an example process for generating a data structure including data representing the physical position of one or more blocks relative to a first block having a common MIB, in accordance with aspects of the disclosure.

The first block can be a base block as described with reference to FIGS. 1 and 3A-3C. The second data structure can be a reduced chip-level graph, in which each MIB or template block used to generate instances in the first data structure are represented by a single instance. FIG. 4B shows an example process 400B for generating a data structure including data representing the physical position of one or more blocks relative to a first block.

The system causes the performance of one or more iterations of a circuit component placement process on the second data structure, according to block 415. A circuit component placement process, as described herein with reference to FIG. 2, can be broken into two stages. The first data structure received can be netlist data generated as part of a first block of a circuit component placement process, in which the physical position of blocks on or within a chip are optimized in accordance with one or more objectives. The system can cause one or more iterations or a second block of the circuit component placement process, in which the placement of circuit components within each block of a received chip-level graph are optimized, in accordance with one or more objectives. In some examples, the system can cause the performance of one or more iterations of the first stage, second, or both the first and second block of the circuit component placement process, using the second data structure as input.

The system can cause the performance of one or more iterations of a circuit component placement process by sending a request including the second data structure to one or more devices configured to perform the circuit component placement process. The system can in some examples receive the output to the circuit component placement, and perform further processing, e.g., as part of a chip design pipeline. In some examples, the system can cause the performance of the circuit component placement process by performing the process using one or more processors.

FIG. 4B is a flow diagram of an example process 400B for generating a data structure including data representing the physical position of one or more blocks relative to a first block having a common MIB, in accordance with aspects of the disclosure. For example, system 100 can perform the process 400B.

The system selects the first block in a group of blocks sharing a common MIB, according to block 420. A common MIB is an example of a template block, which can be used to generate the blocks of the group, which are instances of the template block. Although described with reference to an MIB, in some examples the system can perform the process 400B using blocks generated from memory macros. IP blocks, etc., as described herein with reference to FIG. 1.

The system can select the first block as the base block of the group. The selection can be random, or based on some heuristic, e.g., the physical proximity of the first block relative to other blocks as shown in the chip-level graph. For example, the system can perform a graph search to identify the centroid of a cluster including the group of blocks, to select as the base block the most "central" block of the group. Distance to the centroids can be measured, for example, as the degrees of separation or average degree of separation among nodes representing blocks in the group. In another example, the first block of a netlist instantiated from a template block can be selected as the base block.

The system receives fixed offsets and linear transformations, according to block 425. The fixed offsets. e.g., for horizontal translations or vertical translations, can be based on predetermined widths, heights, and gap distances between blocks of the group of blocks. To receive the linear transformations, the system can traverse the data structure, e.g., a chip-level graph, to identify the spatial relationships between the selected base blocks and non-base blocks from the same instance. Spatial information about each component, such as the physical placement and orientation of each circuit component, can be identified as part of the block-level placement process. Using the spatial information, the system can identify the relationship between the base block and other blocks of the group. For example, if a non-base block is three blocks away from the base block, and the fixed offset width of each block is W, then the linear transformation for representing the physical position of the non-base block will have a horizontal translation of 3 W. In some examples, the system can receive predetermined linear transformations for the physical positions of each non-base block in the group.

For each second block in the group of blocks, the system generates data representing the physical position of the second block, the data including the respective linear transformation for the second block, according to block 430.

Example Computing Environment

Figure 5:
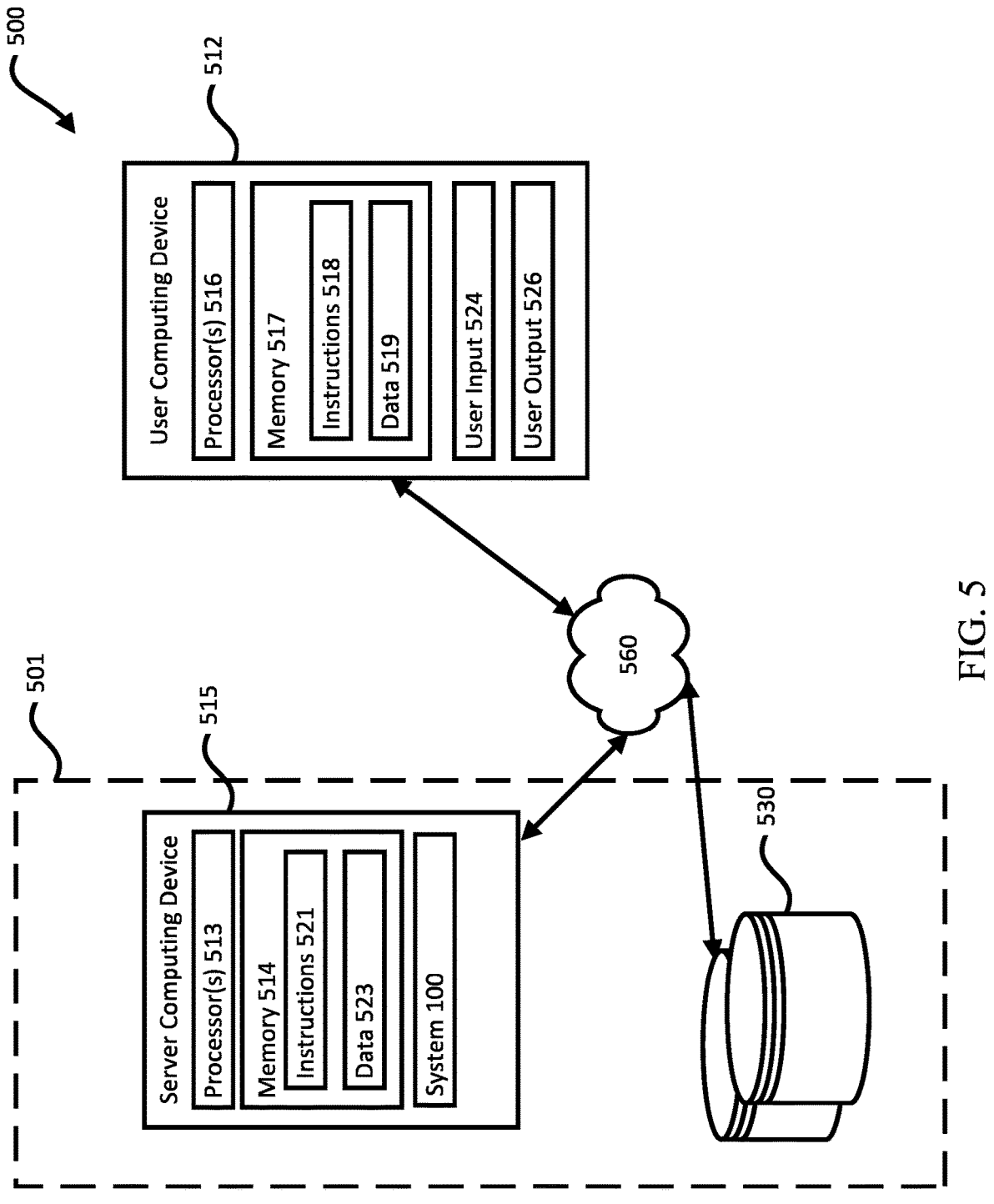
FIG. 5 is a block diagram of an example environment for implementing the chip placement generation system, in accordance with aspects of the disclosure.

FIG. 5 is a block diagram of an example environment 500 for implementing the chip placement generation system 100, in accordance with aspects of the disclosure. The system 100 can be implemented on one or more devices having one or more processors in one or more positions, such as in server computing device 515. User computing device 512 and the server computing device 515 can be communicatively coupled to one or more storage devices 530 over a network 560. The storage device(s) 530 can be a combination of volatile and non-volatile memory and can be at the same or different physical positions than the computing devices 512,

515. For example, the storage device(s) 530 can include any type of non-transitory computer readable medium capable of storing information, such as a hard-drive, solid state drive, tape drive, optical storage, memory card, ROM, RAM, DVD, CD-ROM, write-capable, and read-only memories.

The server computing device 515 can include one or more processors 513 and memory 514. The memory 514 can store information accessible by the processor(s) 513, including instructions 521 that can be executed by the processor(s) 513. The memory 514 can also include data 523 that can be retrieved, manipulated, or stored by the processor(s) 513. The memory 514 can be a type of non-transitory computer readable medium capable of storing information accessible by the processor(s) 513, such as volatile and non-volatile memory. The processor(s) 513 can include one or more central processing units (CPUs), graphic processing units (GPUs), field-programmable gate arrays (FPGAs), and/or application-specific integrated circuits (ASICs), such as tensor processing units (TPUs).

The instructions 521 can include one or more instructions that when executed by the processor(s) 513, causes the one or more processors to perform actions defined by the instructions. The instructions 521 can be stored in object code format for direct processing by the processor(s) 513, or in other formats including interpretable scripts or collections of independent source code modules that are interpreted on demand or compiled in advance. The instructions 521 can include instructions for implementing the system 100 consistent with aspects of this disclosure. The system 100 can be executed using the processor(s) 513, and/or using other processors remotely located from the server computing device 515.

The data 523 can be retrieved, stored, or modified by the processor(s) 513 in accordance with the instructions 521. The data 523 can be stored in computer registers, in a relational or non-relational database as a table having a plurality of different fields and records, or as JSON, YAML, proto, or XML documents. The data 523 can also be formatted in a computer-readable format such as, but not limited to, binary values, ASCII, or Unicode. Moreover, the data 523 can include information sufficient to identify relevant information, such as numbers, descriptive text, proprietary codes, pointers, references to data stored in other memories, including other network locations, or information that is used by a function to calculate relevant data.

The user computing device 512 can also be configured like the server computing device 515, with one or more processors 516, memory 517, instructions 518, and data 519. The user computing device 512 can also include a user output 526, and a user input 524. The user input 524 can include any appropriate mechanism or technique for receiving input from a user, such as keyboard, mouse, mechanical actuators, soft actuators, touchscreens, microphones, and sensors.

The server computing device 515 can be configured to transmit data to the user computing device 512, and the user computing device 512 can be configured to display at least a portion of the received data on a display implemented as part of the user output 526. The user output 526 can also be used for displaying an interface between the user computing device 512 and the server computing device 515. The user output 526 can alternatively or additionally include one or more speakers, transducers or other audio outputs, a haptic interface or other tactile feedback that provides non-visual and non-audible information to the user of the user computing device 512.

Although FIG. 5 illustrates the processors 513, 516 and the memories 514, 517 as being within the computing devices 515, 512, components described in this specification, including the processors 513, 516 and the memories 514, 517 can include multiple processors and memories that can operate in different physical positions and not within the same computing device. For example, some of the instructions 521, 518 and the data 523, 519 can be stored on a removable SD card and others within a read-only computer chip. Some or all the instructions and data can be stored in a position physically remote from, yet still accessible by, the processors 513, 516. Similarly, the processors 513, 516 can include a collection of processors that can perform concurrent and/or sequential operation. The computing devices 515, 512 can each include one or more internal clocks providing timing information, which can be used for time measurement for operations and programs run by the computing devices 515, 512.

The server computing device 515 can be configured to receive requests to process data from the user computing device 512. For example, the environment 500 can be part of a computing platform configured to provide a variety of services to users, through various user interfaces and/or APIs exposing the platform services.

The devices 512, 515 can be capable of direct and indirect communication over the network 560. The devices 515, 512 can set up listening sockets that may accept an initiating connection for sending and receiving information. The network 560 itself can include various configurations and protocols including the Internet, World Wide Web, intranets, virtual private networks, wide area networks, local networks, and private networks using communication protocols proprietary to one or more companies. The network 560 can support a variety of short- and long-range connections. The short- and long-range connections may be made over different bandwidths, such as 2.402 GHz to 2.480 GHz (commonly associated with the Bluetooth® standard), 2.4 GHz and 5 GHz (commonly associated with the Wi-Fi® communication protocol); or with a variety of communication standards, such as the LTE® standard for wireless broadband communication. The network 560, in addition or alternatively, can also support wired connections between the devices 512, 515, including over several types of Ethernet connection.

Although a single server computing device 515 and user computing device 512, are shown in FIG. 5, it is understood that the aspects of the disclosure can be implemented according to a variety of different configurations and quantities of computing devices, including in paradigms for sequential or parallel processing, or over a distributed network of multiple devices. In some implementations, aspects of the disclosure can be performed on a single device, and any combination thereof.

Aspects of this disclosure can be implemented in digital circuits, computer-readable storage media, as one or more computer programs, or a combination of one or more of the foregoing. The computer-readable storage media can be non-transitory, e.g., as one or more instructions executable by a cloud computing platform and stored on a tangible storage device.

In this specification the phrase "configured to" is used in different contexts related to computer systems, hardware, or part of a computer program, engine, or module. When a system is said to be configured to perform one or more operations, this means that the system has appropriate software, firmware, and/or hardware installed on the system that, when in operation, causes the system to perform the one or more operations. When some hardware is said to be configured to perform one or more operations, this means that the hardware includes one or more circuits that, when in operation, receive input and generate output according to the input and corresponding to the one or more operations. When a computer program, engine, or module is said to be configured to perform one or more operations, this means that the computer program includes one or more program instructions, that when executed by one or more computers, causes the one or more computers to perform the one or more operations.

Unless otherwise stated, the foregoing alternative examples are not mutually exclusive but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including," and the like, should not be interpreted as limiting the subject matter of the claims to the specific examples; rather, the examples are intended to illustrate only one of many possible implementations. Further, the same reference numbers in different drawings can identify the same or similar elements.

The invention claimed is:

1. A method comprising:
   receiving, by one or more processors, a first data structure comprising data representing the physical position of each block of a group of blocks in an integrated circuit (IC), the group of blocks comprising a first block and one or more second blocks, each block comprising one or more respective circuit components;
   generating from the first data structure, by the one or more processors, a second data structure, comprising data representing the physical position of the one or more second blocks relative to the first block, wherein the physical position of each block is represented as a respective position of a floorplan of the integrated circuit, and wherein generating the second data structure comprises:
      for each second block, generating data representing the physical position of the second block, the data including a respective linear transformation of the physical position of the first block along the floorplan of the integrated circuit; and
   at least partially causing, by the one or more processors, the performance of one or more iterations of a circuit component placement process on the second data structure, wherein the circuit component placement process comprises generating data representing the physical position of circuit components of a block represented by the second data structure in accordance with one or more objectives.

2. The method of claim 1, wherein generating the second data structure comprises:
   for each circuit component of a second block, generating data representing the physical position of the circuit component relative to the physical position of a respective circuit component in the first block and one or more offset values.

3. The method of claim 1, wherein generating the second data structure comprises:
   generating, as part of the second data structure, data representing block-specific interconnections for the one or more second blocks, a block-specific interconnection representing a unique connection between a second block and another circuit component.

4. The method of claim 1, the method further comprising:
   receiving, by the one or more processors, the one or more offset values, the one or more offset values at least partially based on the physical dimensions of the blocks in the group; and
   receiving, for each second block and by the one or more processors, the respective linear transformation of the physical position of the second block relative to the physical position of the first block and the one or more offset values.

5. The method of claim 1, wherein a linear transformation represented in the generated data comprises at least one of:
   a horizontal translation along the floorplan, a vertical translation along the floorplan, a rotation along the floorplan, and a mirror-flip along the floorplan.

6. The method of claim 1, wherein the first data structure is generated at least partially using the circuit component placement process, the circuit component placement process comprising updating the data representing the physical position of blocks in the first data structure in accordance with the one or more objectives.

7. The method of claim 6, wherein the one or more objectives comprise at least one of:
   increasing performance of the integrated circuit according to one or more predetermined metrics;
   reducing the power requirement of the integrated circuit;
   reducing the length of interconnections between circuit components on the integrated circuit; and
   reducing the physical area of the integrated circuit on a substrate on which the integrated circuit is implemented.

8. The method of claim 1, wherein causing the performance of one or more iterations of the circuit component placement process comprises performing, by the one or more processors, the one or more iterations.

9. The method of claim 1, wherein each block of the group of blocks represented by the first data structure is a uniquified instance of a template block.

10. The method of claim 9, wherein the template block is one of:
   a multiply-instantiated block (MIB), one or more intellectual property (IP) blocks, a memory macro, or one or more logic gates.

11. A system comprising one or more processors, the one or more processors configured to:
   receive, by the one or more processors, a first data structure comprising data representing the physical position of each block of a group of blocks in an integrated circuit (IC), the group of blocks comprising a first block and one or more second blocks, each block comprising one or more respective circuit components;
   generate from the first data structure, by the one or more processors, a second data structure comprising data representing the physical position of the one or more second blocks relative to the first block, wherein the physical position of each block is represented as a respective position of a floorplan of the integrated circuit, and wherein generating the second data structure comprises:
      for each second block, generating data representing the physical position of the second block, the data including a respective linear transformation of the physical position of the first block along the floorplan of the integrated circuit; and at least partially cause, by the one or more processors, the performance of one or more iterations of a circuit component placement process on the second data structure, wherein the circuit component placement process comprises generating data representing the physical position of circuit components of a block represented by the second data structure in accordance with one or more objectives.

12. The system of claim 11, wherein in generating the second data structure, the one or more processors are further configured to:

for each circuit component of a second block, generate data representing the physical position of the circuit component relative to the physical position of a respective circuit component in the first block and one or more offset values.

13. The system of claim 11, wherein in generating the second data structure, the one or more processors are further configured to:

generate, as part of the second data structure, data representing block-specific interconnections for the one or more second blocks, a block-specific interconnection representing a unique connection between a second block and another circuit component.

14. The system of claim 11, wherein the one or more processors are further configured to:

receive the one or more offset values, the one or more offset values at least partially based on the physical dimensions of the blocks in the group; and receive, for each second block, the respective linear transformation of the physical position of the second block relative to the physical position of the first block and the one or more offset values.

15. The system of claim 11, wherein a linear transformation represented in the generated data comprises at least one of:

a horizontal translation along the floorplan, a vertical translation along the floorplan, a rotation along the floorplan, or a mirror-flip along the floorplan.

16. The system of claim 11, wherein the first data structure is generated at least partially using the circuit component placement process, the circuit component placement process comprising updating the data representing the physical position of blocks in the first data structure in accordance with the one or more objectives.

17. The system of claim 16, wherein the one or more objectives comprise at least one of:

increasing performance of the integrated circuit according to one or more predetermined metrics;

reducing the power requirement of the integrated circuit;

reducing the length of interconnections between circuit components on the integrated circuit; and reducing the physical area of the integrated circuit on a substrate on which the integrated circuit is implemented.

18. One or more non-transitory computer-readable storage media encoding instructions that when performed by one or more processors, causes the one or more processors to perform operations comprising:

receiving a first data structure comprising data representing the physical position of each block of a group of blocks in an integrated circuit (IC), the group of blocks comprising a first block and one or more second blocks, each block comprising one or more respective circuit components;

generating, from the first data structure, a second data structure comprising data representing the physical position of the one or more second blocks relative to the first block, wherein the physical position of each block is represented as a respective position of a floorplan of the integrated circuit, and wherein generating the second data structure comprises:

for each second block, generating data representing the physical position of the second block, the data including a respective linear transformation of the physical position of the first block along the floorplan of the integrated circuit; and at least partially causing the performance of one or more iterations of a circuit component placement process on the second data structure, wherein the circuit component placement process comprises generating data representing the physical position of circuit components of a block represented by the second data structure in accordance with one or more objectives.

* * * * *